United States Patent
Kang et al.

(10) Patent No.: US 9,536,456 B2
(45) Date of Patent: Jan. 3, 2017

(54) IMAGE DISPLAY DEVICE

(71) Applicant: LG ELECTRONICS INC., Seoul (KR)

(72) Inventors: Kitae Kang, Gyeonggi-do (KR); Jaehyun Sung, Gyeonggi-do (KR); Jongwon Song, Gyeonggi-do (KR); Hyunjong Ryu, Gyeonggi-do (KR); Sangdon Park, Gyeonggi-do (KR); Kyoungmok Kim, Gyeonggi-do (KR)

(73) Assignee: LG ELECTRONICS, INC., Seoul (KR)

( * ) Notice: Subject to any disclaimer, the term of this patent is extended or adjusted under 35 U.S.C. 154(b) by 280 days.

(21) Appl. No.: 14/184,769

(22) Filed: Feb. 20, 2014

(65) Prior Publication Data

US 2015/0009635 A1    Jan. 8, 2015

(30) Foreign Application Priority Data

Jul. 2, 2013   (KR) .................. 10-2013-0077365
Jul. 2, 2013   (KR) .................. 10-2013-0077367

(51) Int. Cl.
| | | |
|---|---|---|
| *H05K 1/02* | (2006.01) | |
| *G09F 9/30* | (2006.01) | |
| *G06F 1/16* | (2006.01) | |
| *G09F 15/00* | (2006.01) | |
| *G09F 19/02* | (2006.01) | |
| *H04M 1/02* | (2006.01) | |
| *H04N 5/64* | (2006.01) | |

(52) U.S. Cl.
CPC ............. *G09F 9/301* (2013.01); *G06F 1/1652* (2013.01); *G09F 15/0025* (2013.01); *G09F 19/02* (2013.01); *H04M 1/0268* (2013.01); *H04N 5/64* (2013.01); *H05K 1/028* (2013.01)

(58) Field of Classification Search
CPC ...... G09F 9/301; G09F 15/0025; G09F 19/02; G06F 1/1652; H05K 1/028; H04M 1/0268
USPC .................................................... 361/679.21
See application file for complete search history.

(56) References Cited

U.S. PATENT DOCUMENTS

| | | | | |
|---|---|---|---|---|
| 2006/0107566 A1* | 5/2006 | Van Rens | ................ | G09F 9/35 40/515 |
| 2010/0141605 A1* | 6/2010 | Kang | ................... | G06F 1/1626 345/174 |
| 2010/0277860 A1* | 11/2010 | Jeong | ................ | H04M 1/0216 361/679.27 |
| 2013/0169520 A1* | 7/2013 | Cho | ...................... | G06F 3/0488 345/156 |
| 2013/0207946 A1* | 8/2013 | Kim | .................... | G09G 3/3225 345/204 |

(Continued)

FOREIGN PATENT DOCUMENTS

| | | |
|---|---|---|
| CN | 1744803 A | 3/2006 |
| CN | 1819416 A | 8/2006 |

(Continued)

*Primary Examiner* — Courtney Smith
*Assistant Examiner* — Jessey R Ervin
(74) *Attorney, Agent, or Firm* — Dentons US LLP

(57) ABSTRACT

An image display device includes a flexible display unit bendable by an external force between a first state and a second state having different radii of curvature from each other, a pressing member disposed to face the flexible display unit and configured to apply the external force to the flexible display unit in a bending manner, and a drive part configured to pull both ends of the pressing member such that the pressing member is bent.

22 Claims, 11 Drawing Sheets

(56) References Cited

U.S. PATENT DOCUMENTS

| | | | | |
|---|---|---|---|---|
| 2014/0078154 A1* | 3/2014 | Payne | ............... | G02B 26/005 |
| | | | | 345/501 |
| 2014/0101560 A1* | 4/2014 | Kwak | ............... | G06F 1/1652 |
| | | | | 715/738 |
| 2014/0202014 A1* | 7/2014 | Choi | ............... | G01B 21/22 |
| | | | | 33/303 |

FOREIGN PATENT DOCUMENTS

| | | |
|---|---|---|
| CN | 201590966 U | 9/2010 |
| JP | 2006023676 A | 1/2006 |

\* cited by examiner

IMAGE DISPLAY DEVICE

CROSS-REFERENCE TO RELATED APPLICATION

Pursuant to 35 U.S.C. §119(a), this application claims the benefit of earlier filing date and right of priority to Korean Application No. 10-2013-0077365, filed on Jul. 2, 2013, and Korean Application No. 10-2013-0077367, filed on Jul. 2, 2013, the contents of which are incorporated by reference herein in their entireties.

BACKGROUND OF THE DISCLOSURE

1. Field of the Disclosure

This specification relates to an image display device having a flexible display unit.

2. Background of the Disclosure

In general, an image display device (apparatus) includes a device of recording and/or reproducing images and/or a device of recording and/or reproducing audio. Examples of the image display device may include a TV set, a monitor, a projector, a tablet, a smart phone and the like.

As it becomes multifunctional, the image display device can be allowed to capture still images or moving images, play music or video files, play games, receive broadcasts and the like, so as to be implemented as an integrated multimedia player.

Many efforts are undergoing to support and enhance various functions such as multimedia player in view of hardware or software improvements. A structural change and improvement for simplifying an assembly structure of the image display device may be included in the attempts (efforts) corresponding to the hardware improvement.

As one example of the structural change and improvement, various studies and proposals for an image display device having a flexible display device which is transformable in shape are undergoing. To implement it, it may be desirable to smoothly bend (curve) the flexible display unit and smoothly restore it to a flat state.

SUMMARY OF THE DISCLOSURE

Therefore, an aspect of the detailed description is to provide an image display device having a transformable structure of a flexible display unit.

Another aspect of the detailed description is to provide an image display device capable of adjusting tension (or a tensile force) of a wire which implements a transformable structure of a flexible display unit.

To achieve these and other advantages and in accordance with the purpose of this specification, as embodied and broadly described herein, there is provided an image display device including a flexible display unit bendable by an external force between a first state and a second state having different radii of curvature from each other, a pressing member disposed to face the flexible display unit and to apply the external force to the flexible display unit in a bending manner, and a drive part to pull both ends of the pressing member such that the pressing member is bent.

In accordance with one exemplary embodiment of the present disclosure, the pressing member may be slidable on a rear surface of the flexible display unit while pressing the rear surface when the both ends thereof are pulled by the drive part.

The image display device may further include a supporting guide disposed on the rear surface of the flexible display unit to cover a part of the pressing member in order to prevent buckling of the pressing member when the both ends of the pressing member are pulled. The supporting guide may be provided in plurality, and the plurality of supporting guides may be disposed with a predetermined spacing therebetween along a lengthwise direction of the pressing member.

In accordance with another exemplary embodiment of the present disclosure, the drive part may pull the both ends of the pressing member in a first direction to convert the flexible display unit from the first state to the second state, and pull the both ends of the pressing member in a second direction, opposite to the first direction, to restore the flexible display unit from the second state to the first state.

The drive part may include a driving unit having a driving shaft to execute a rotation motion, and a first wire connected to the pressing member and wound responsive to rotation of the driving shaft so as to pull the both ends of the pressing member in the first direction.

The driving shaft may be provided with a first insertion hole in which the first wire is inserted, and the first wire may bi-directionally extend from the first insertion hole to be connected to the pressing member. The first insertion hole may be disposed in parallel to a lengthwise direction of the pressing member when the pressing member is in the first state.

The drive part may further include a second wire connected to the pressing member to pull the both ends of the pressing member in the second direction.

The driving shaft may be provided with a second insertion hole in which the second wire is inserted, and the second wire may bi-directionally extend from the second insertion hole to be connected to the pressing member. The first and second insertion holes may be located at positions spaced from each other along an outer circumference of the driving shaft. The first and second insertion holes may be orthogonal to each other.

The first wire may be wound on the driving shaft and the second wire may be unwound from the driving shaft when the driving shaft is rotated by a preset angle along a direction that the flexible display unit is converted from the first state to the second state.

The first wire may be connected to one surface of the pressing member to pull the both ends of the pressing member in the first direction, in response to the rotation of the driving shaft in the first rotating direction, and wherein the second wire may be connected to an other surface of the pressing member to pull the both ends of the pressing member in the second direction, in response to the rotation of the driving shaft in the second rotating direction.

The pressing member may be provided with a through hole through which the second wire is inserted in such a manner that the second wire extends from the driving shaft and is connected to the other surface of the pressing member.

The drive part may further include a reduction gear configured to connect a rotation shaft of the driving unit and the driving shaft of the driving unit to each other.

In accordance with another exemplary embodiment of the present disclosure, the drive part may include a driving unit connected to a pinion, a rack unit slidable in response to rotation of the pinion, and a first wire connected to the rack unit and the pressing member, respectively, to pull the pressing member in a first direction.

In accordance with one exemplary embodiment of the present disclosure, the drive part may further include a second wire connected to the rack unit and the pressing member, respectively, to pull the pressing member in a second direction, different from the first direction.

The second wire may extend from the rack unit with at least a part thereof bent to be inserted through the pressing member.

The rack unit may include first and second racks connected to the pinion to be slidable opposite to each other along the rotation of the pinion, and the first wire may extend from ends of the first and second racks in opposite directions to each other.

The first wire may be connected to one end of the first rack, and the second wire may be connected to the other end of the first rack to pull the pressing member in the second direction, different from the first direction.

In accordance with another exemplary embodiment of the present disclosure, there is provided an image display device comprising a flexible display unit bendable by an external force between a first state and a second state having different radii of curvature from each other, a pressing member disposed to face the flexible display unit and to apply the external force to the flexible display unit in a bending manner, a drive part to pull both ends of the pressing member by use of a wire such that the pressing member is bent, and a tension adjustment part mounted onto the pressing member and connected to the wire to adjust a tensile force of the wire.

In accordance with one exemplary embodiment of the present disclosure, the tension adjustment part may include a frame member formed of a material different from the pressing member and connected to the pressing member.

An accommodation recess recessed from one surface toward the other surface of the pressing member, and at least part of the frame member may be accommodated in the accommodation recess.

The tension adjustment part may further include a length adjusting unit disposed on the frame member and changeable in length, and a connection member connected to the length adjusting unit and the wire, respectively, to adjust the tensile force of the wire by changing the length of the length adjusting unit.

The frame member may include a base accommodated in the accommodation recess formed on the one surface of the pressing member, and a protrusion having a through hole through which the wire is inserted and protruding from the base such that the length adjusting unit is mounted thereto.

The length adjusting unit may include a first screw mounted to the frame member, and a second screw coupled to the first screw and connected to the connection member.

Through holes for insertion of the wire therethrough may be formed through the first screw and the second screw, respectively.

In accordance with another exemplary embodiment of the present disclosure, the drive part may include a driving unit to generate a rotation force, a first wire connected to the driving unit to pull the both ends of the pressing member in a first direction using the rotation force, and a second wire connected to the driving unit to pull the both ends of the pressing member in a second direction, different from the first direction.

The tension adjustment part may include a first tension adjusting unit and a second tension adjusting unit connected to the first and second wires, respectively.

The pressing member may be disposed in parallel to the flexible display unit to press at least a part of the flexible display unit when the both ends thereof are pulled by the drive part. The first and second tension adjusting units may be mounted onto at least one of one surface and the other surface of the pressing member.

Also, the pressing member may be provided with a through hole, through which the second wire is inserted such that the second wire extends from the driving shaft to the other surface of the pressing member.

Further scope of applicability of the present application will become more apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the detailed description.

BRIEF DESCRIPTION OF THE DRAWINGS

The accompanying drawings, which are included to provide a further understanding of the disclosure and are incorporated in and constitute a part of this specification, illustrate exemplary embodiments and together with the description serve to explain the principles of the disclosure.

In the drawings.

DETAILED DESCRIPTION OF THE DISCLOSURE

Description will now be given in detail of the exemplary embodiments, with reference to the accompanying drawings.

For the sake of brief description with reference to the drawings, the same or equivalent components may be provided with the same reference numbers, and description thereof may not be repeated.

An image display device according to the present disclosure may include a device of recording and/or reproducing images and/or a device for recording and/or reproducing audio by receiving and outputting broadcasts. Hereinafter, a TV as an example of the image display device will be illustrated.

Figure 1:
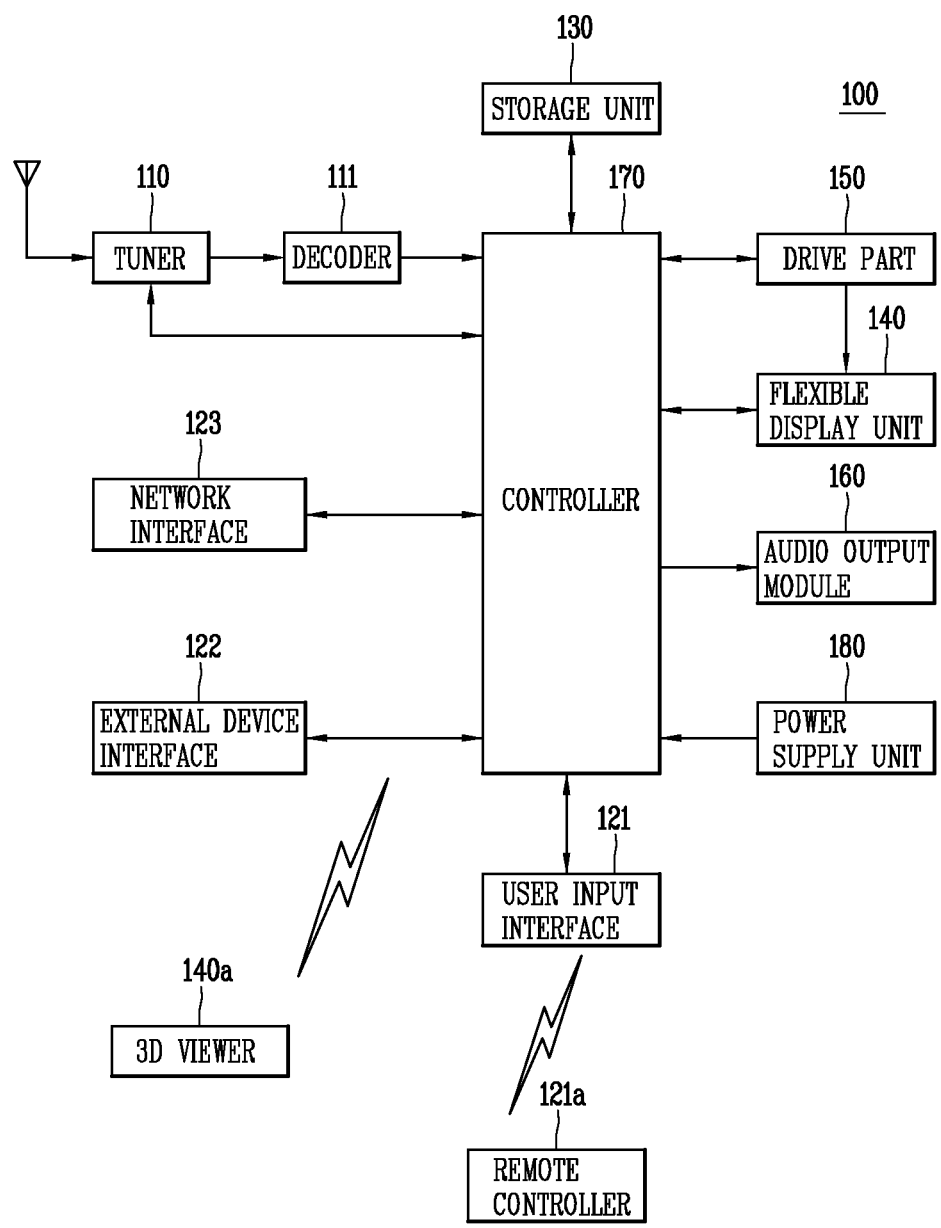
FIG. 1 is a block diagram of an image display device and a remote controller in accordance with an exemplary embodiment of the present disclosure.

FIG. 1 is a block diagram of an image display device 100 and a remote controller 121a according to the present disclosure.

As illustrated in FIG. 1, the image display device 100 may include a tuner 110, a decoder 111, an external device interface 122, a network interface 123, a storage unit 130, a user input interface 121, a controller 170, a flexible display unit 140, a drive part 150, an audio output module 160, a power supply unit 180, and a 3D viewer 140a.

The tuner 110 may select a radio frequency (RF) broadcast signal, which corresponds to a channel selected by a user, among RF broadcast signals received through an antenna, or every pre-stored channel. The tuner 110 may also convert the selected RF broadcast signal into a medium frequency signal or a baseband video or audio signal.

For example, when the RF broadcast signal selected is a digital broadcast signal, the tuner 110 may convert the RF broadcast signal into a digital IF signal (DIF). On the other hand, when the RF broadcast signal is an analog broadcast signal, the tuner 110 may convert the RF broadcast signal into an analog baseband video or audio signal (CVBS/SIF). That is, the analog baseband image or audio signal (CVBS/SIF) outputted from the tuner 110 may be inputted directly into the controller 170.

Also, the tuner 110 may receive a signal carrier RF broadcast signal according to an advanced television systems committee (ATSC) standard or a multi-carrier RF broadcast signal according to a digital video broadcasting (DVB) standard.

Meanwhile, the tuner 110 may sequentially select RF broadcast signals of all the broadcast channels stored through a channel memory function, of RF broadcast signals received via an antenna, and convert those RF broadcast signals into a medium frequency signal or a baseband video or audio signal.

The decoder 111 may execute a decoding operation by receiving a digital IF signal (DIF) converted in the tuner 110.

For example, when the digital IF signal outputted from the tuner 110 is a signal according to the ATSC standard, the decoder 120 may perform 8-vestigal side band (8-VSB) demodulation. Here, the decoder 111 may also perform trellis decoding, de-interleaving, reed Solomon decoding and the like. To this end, the decoder 120 may include a trellis decoder, de-interleaver, a reed Solomon decoder and the like.

As another example, when the digital IF signal (DIF) outputted from the tuner 110 is a signal according to the DVB standard, the decoder 111 may perform a coded orthogonal frequency division modulation (COFDMA) demodulation. Here, the decoder 111 may also perform convolution decoding, de-interleaving, reed Solomon decoding and the like. To this end, the decoder 111 may include a convolution decoder, a de-interleaver, a reed Solomon decoder and the like.

The decoder 111 may output a stream signal after decoding and channel decoding. Here, the stream signal may be a signal in which a video signal, an audio signal and a data signal are multiplexed. As one example, the stream signal may be an MPEG-2 transport stream (TS) signal obtained by multiplexing an MPEG-2 video signal and a Dolby AC-3 audio signal. In detail, an MPEG-2 TS signal may include a 4-byte header and a 184-byte payload.

The decoder 111 may be provided separately according to the ATSC standard and the DVB standard. That is, an ATSC decoder and a DVB decoder may be provided.

The stream signal output from the decoder 111 may be inputted into the controller 170. The controller 170 may perform demultiplexing, video/audio signal processing and the like, output video on the flexible display unit 140 and output audio to the audio output module 160.

The external device interface 122 may connect an external device and the image display device 100 to each other. To this end, the external device interface 122 may include an A/V input/output unit (not shown) or a wireless communication unit (not shown).

The external device interface 122 may be connected, in a wired or wireless manner, to an external device, such as a digital versatile disk (DVD), a Bluray, a game machine, a camera, a camcorder, a laptop computer (notebook) and the like. The external device interface 122 may transfer a video, audio or data signal input from the exterior via the connected external device to the controller 170 of the image display device 100, and also output a video, audio or data signal processed in the controller 170 to the external device. For this, the external device interface 122 may include the A/V input/output unit or the wireless communication unit.

The A/V input/output unit may include a USB terminal, a composite video banking sync (CVBS) terminal, a component terminal, a S-video terminal (analog), a digital visual interface (DVI) terminal, a high definition multimedia interface (HDMI) terminal, an RGB terminal, a D-SUB terminal, and the like to allow video and audio signals of the external device to be inputted into the image display device 100.

The wireless communication unit may execute short-range wireless communication with other electronic devices. The image display device 100 may be connected to the other electronic device via a network according to communication standards, such as Bluetooth, radio frequency identification (RFID), infrared data association (IrDA), ultra wideband (UWB), Zigbee and the like.

The external device interface 122 may also be connected via at least one of various set-top boxes and the aforementioned various terminals, to execute input/output operations with the set-top boxes.

The external device interface 122 may execute data transmission and reception with the 3D viewer 140a.

The network interface 123 may provide an interface for connecting the image display device 100 to a wired or wireless network which includes an Internet network. The network interface 123 may include an Ethernet terminal for connection to the wired network, and use communication standards, such as wireless LAN (WLAN) (Wi-Fi), wireless broadband (Wibro), world interoperability for microwave access (Wimax), high speed downlink packet access (HSDPA) and the like for connection to the wireless network.

The network interface 123 may receive contents or data provided by a contents provider or a network operator via a network. That is, the network interface 123 may receive contents, such as a movie, an advertisement, a game, a video on demand (VOD), a broadcast signal provided by the network operator, and related information via a network. The network interface 123 may also receive update information related to firmware and update files provided by the network operator. Also, the network interface 123 may transmit data to the contents provider or the network operator.

The network interface 123 may be connected to, for example, an Internet protocol (IP) TV, so as to receive a video, audio or data signal processed in an IPTV set-top box and transfer it to the controller 170 to allow bi-directional communication. The network interface 123 may also transfer signals processed in the controller 170 to the IPTV set-top box.

The IPTV may indicate ADSL-TV, VDSL-TV, FTTH-TV or the like or indicate TV over DSL, Video over DSL, TV overIP (TVIP), Broadband TV (BTV) or the like, according to a type of transmission network. Also, the IPTV may indicate an Internet-accessible Internet TV, and a full-browsing TV.

The storage unit 130 may store programs for signal processing and control by the controller 170, and also store processed video, audio or data signals.

The storage unit 130 may execute a function of temporarily storing a video, audio or data signal input via the external device interface 122. Also, the storage unit 130 may store information related to a predetermined broadcast channel through a channel memory function of a channel map and the like.

The storage unit 130 may include at least one storage medium of a flash memory-type storage medium, a hard disc-type storage medium, a multimedia card micro-type storage medium, a card-type memory (for example, SD or XD memory), a random access memory (RAM), a read-only memory (ROM) (e.g., electrically erasable programmable ROM (EEPROM)), and the like. The image display device 100 may reproduce a file (a video file, a still image file, a music file, a document file, etc.) stored in the storage unit 130 to provide to a user.

FIG. 1 illustrates an exemplary embodiment having the storage unit 130, separate from the controller 170. However, the storage unit 140 may alternatively be configured to be included in the controller 170.

The user input interface 121 may transfer a user-input signal to the controller 170, or a signal from the controller 170 to the user.

For example, the user input interface 121 may receive a user input signal, such as a power on/off, a channel selection, a screen setting and the like from the remote controller 121a, or transmit a signal from the controller to the remote controller 121a, according to various communication standards, such as RF communication, IR communication and the like.

The user input interface 121, for example, may also transfer a user input signal, which is inputted from a local key (not shown), such as a power key, a channel key, a volume key, or a setting key, to the controller 170, for example.

Also, for example, the user input interface 121 may transfer a user input signal, which is inputted from a sensing unit (not shown) for sensing a user's gesture, to the controller 170 or transmit a signal from the controller 170 to the sensing unit (not shown). Here, the sensing unit may include a touch sensor, a voice sensor, a position sensor, a motion sensor and the like.

The controller 170 may demultiplex stream, which is inputted via the tuner 110, the decoder 111 or the external device interface 122 or process the demultiplexed signals, to generate and output signals for outputting video or audio.

The video signal processed in the controller 170 may be inputted to the flexible display unit 140 to be outputted as an image corresponding to the image signal. Also, the video signal processed in the controller 170 may be inputted to an external output device through the external device interface 122.

The audio signal processed in the controller 170 may be outputted to the audio output module 160. The audio signal processed in the controller 170 may be inputted to an external output device through the external device interface 122. Although not shown in FIG. 1, the controller 170 may include a demultiplexer, an image processor and the like.

Besides, the controller 170 may control an overall operation of the image display device 100. For example, the controller 170 may control the tuner 110 to select an RF broadcast corresponding to a user-selected channel or a pre-stored channel.

The controller 170 may also control the image display device 100 by a user command inputted via the user input interface 121 or an internal program.

For example, the controller 170 may control the tuner 110 to input a signal of a channel, which is selected in response to a predetermined channel select command received via the user input interface 121. The controller 170 may then process a video, audio or data signal of the selected channel. The controller 170 may control information related to the user-selected channel to be outputted through the flexible display unit 140 or the audio output module 160 together with the processed video or audio signal.

As another example, the controller 170 may control a video signal or an audio signal, which is inputted from an external device, for example, a camera or a camcorder through the external device interface 122 in response to an external device image reproduce command received through the user input interface 121, to be outputted through the flexible display unit 140 or the audio output module 160.

In the meantime, the controller 170 may control the flexible display unit 140 to display an image. For example, the controller 170 may control the flexible display unit 140 to output a broadcast image inputted through the tuner 110, an externally input image inputted through the external device interface 122, an image inputted through the network interface 123, or an image stored in the storage unit 130.

Here, the image output on the flexible display unit 140 may be a still image or a video, and a 2D or 3D image.

The controller 170 may allow a predetermined object within the image displayed on the flexible display unit 140 to be generated and displayed as a 3D object. For example, the object may be at least one of an accessed web screen (a newspaper, a journal, etc.), an electronic program guide (EPG), various menus, a widget, an icon, a still image, a video, and text.

The 3D object may be processed to have a different depth from the image displayed on the flexible display unit 140. Preferably, the 3D object may be processed to seem to protrude more than the image displayed on the flexible display unit 140.

In the meantime, the controller 170 may recognize a user's location based on an image captured by the capturing element (not shown). For example, the controller 170 may recognize a distance (z-axial coordinates) between the user and the image display device 100. Also, the controller 170 may recognize x-axial coordinates and y-axial coordinates within the image display device 100 corresponding to the user's location.

Although not shown, the image display device 100 may further include a channel browsing processor, which generates a thumbnail image corresponding to a channel signal or an externally input signal. The channel browsing processor may receive a stream signal outputted from the decoder 111 or a stream signal outputted from the external device interface 122, extract an image from the input stream signal, and generate a thumbnail image. The generated thumbnail image may be inputted to the controller 170 as it is or after being encoded. Also, the generated thumbnail image may be inputted to the controller 170 after being encoded into a stream format. The controller 170 may output on the flexible display unit 140 a thumbnail list including a plurality of thumbnail images using the input thumbnail image. The thumbnail list may be displayed in a briefly viewing manner in which the list is displayed on a partial region with displaying a predetermined image on the flexible display unit 140, or in a fully viewing manner in which the list is displayed on most regions of the flexible display unit 140.

The flexible display unit 140 may generate a driving signal by converting an image signal, a data signal, an OSD signal and a control signal processed in the controller 170, or an image signal, a data signal and a control signal received via the external device interface 122.

The present disclosure illustrates that the flexible display unit 140 is transformable (variable) into a flat form or a curved form. When the flexible display unit 140 is transformed into the curved form like surrounding a user located in front thereof, the flexible display unit 140 may provide the user with intense quality of image and allow the user to feel more involved in an image displayed thereon. The flexible display unit 140 may be implemented by an OLED panel, for example.

The flexible display unit 140 may be configured to provide a 3D image to a user. To view the 3D image, the flexible display unit 140 may be classified into an additional displaying method and an independent displaying method.

The independent displaying method may be configured such that a 3D image can be implemented solely by the flexible display unit 140 without a separate 3D viewer 140*a*, for example, 3D glasses or the like. Various technologies such as a lenticular technology, a parallax barrier technology and the like may be applied as the independent displaying method.

The additional displaying method may be configured to implement a 3D image by using the 3D viewer 140*a* in addition to the flexible display unit 140. As one example, various methods such as a head mount display (HMD) type, a glass type and the like may be applied. Also, the glass type may be divided into a passive glass type such as a polarized glass type and the like, and an active glass type such as a shutter glass type and the like. The HMD type may also be divided into a passive HMD type and an active HMD type.

The flexible display unit 140 may be implemented as a touch screen so as to be used as an input device as well as an output device.

The drive part 150 may transform the flexible display unit 140 into a flat form or a curved form. The drive part 150 may transmit an electric signal to the flexible display unit 140 such that the flexible display unit 140 can be transformed by itself, or apply a physical force to the flexible display unit 140 directly or indirectly to transform the flexible display unit 140.

The audio output module 160 may output sound by receiving an audio signal processed in the controller 170, for example, a stereo signal, a 3.1 channel signal or a 5.1 channel signal. The audio output module 160 may be implemented into various types of speakers.

Meanwhile, to sense a user's gesture, as aforementioned, the image display device 100 may further include a sensing unit (not shown) having at least one of a touch sensor, a voice sensor, a location sensor, and a motion sensor. A signal sensed by the sensing unit may be transferred to the controller 170 via the user input interface 121.

The controller 170 may sense a user's gesture based on an image captured by the capturing element (not shown), a signal sensed by the sensing unit (not shown) or a combination thereof.

The power supply unit 190 may supply power to every component of the image display device 100. Especially, the power supply unit 190 may supply power to the controller 170 which may be implemented in a form of a system on chip (SOC), the flexible display unit 140 to display an image, and the audio output module 185 to output an audio. Also, depending on embodiments, power may be supplied to a heat generator including a hot wire.

The remote controller 121*a* may transmit a user input to the user input interface 121. To this end, the remote controller 121*a* may use various communication standards, such as IR communication, RF communication, Bluetooth, ultra wideband (UWB), Zigbee and the like. Also, the remote controller 121*a* may receive a video, audio or data signal output from the user input interface 121, so as to display the signal on the remote controller 121*a* or output the signal on the remote controller 121*a* in form of sound.

The image display device 100 may be a fixed digital broadcast receiver capable of receiving at least one of ATSC (8-VSB) broadcast programs, DVB-T (COFDM) broadcast programs, and ISDB-T (BST-OFDM) broadcast programs or a mobile digital broadcast receiver capable of receiving at least one of terrestrial DMB broadcast programs, satellite DMB broadcast programs, ATSC-M/H broadcast programs, DVB-H (COFDM) broadcast programs, and Media Forward Link Only (MediaFLO) broadcast programs. Alternatively, the image display device 100 may be an IPTV digital broadcast receiver capable of receiving cable broadcast programs, satellite broadcast programs or IPTV programs.

The image display device disclosed herein may include a TV receiver, a cellular phone, a smart phone, a notebook computer, a digital broadcasting terminal, a personal digital assistant (PDA), a portable multimedia player (PMP) and the like.

The block diagram of the image display device illustrated in FIG. 1 is a block diagram of one exemplary embodiment. Each component of the block diagram may be combined, added or omitted according to the configuration of the image display device 100. If necessary, two or more components may be combined into one component, or one component may be divided into two components. Also, a function performed in each block is merely illustrative, and a detailed operation or device may not limit the scope of the present disclosure.

Figure 2:
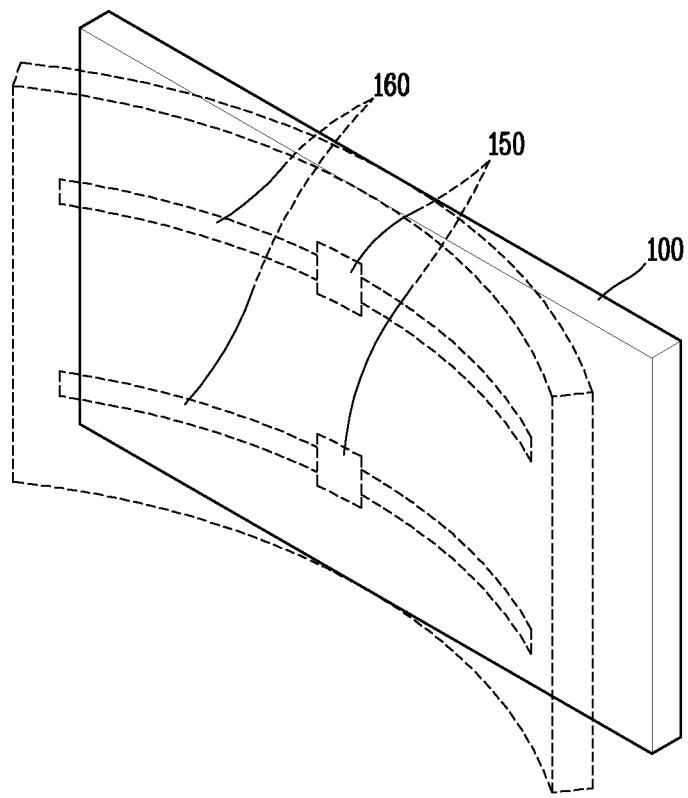
FIG. 2 is a conceptual view illustrating an image display device in accordance with one exemplary embodiment.
Figure 3:
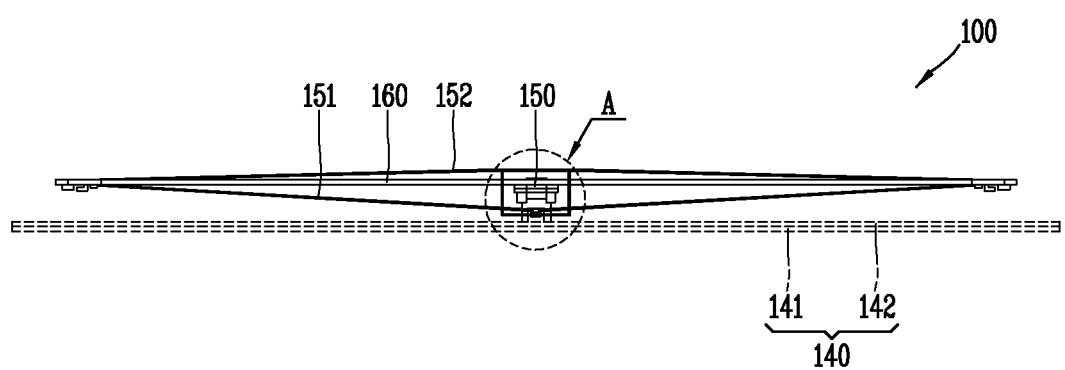
FIG. 3 is a top conceptual view illustrating a structure of transforming a shape of a flexible display unit illustrated in FIG. 2.

FIG. 2 is a conceptual view illustrating an image display device 100 in accordance with one exemplary embodiment, and FIG. 3 is a top conceptual view illustrating a structure of transforming a shape of a flexible display unit 140 illustrated in FIG. 2.

As illustrated in FIGS. 2 and 3, the flexible display unit 140 may be bent by an external force between a first state and a second state which have different radii of curvature from each other. For example, the first state may be a flat state of the flexible display unit 140, and the second state may be a bent (curved) state of the flexible display unit 140.

When the flexible display unit 140 is bent (curved) by an external force to surround a user located in front thereof, the flexible display unit 140 may provide the user with realistic quality of image and the sense of immersion. The flexible display unit 140 transformed into the bent shape may be restored to the flat state by an external force.

The flexible display unit 140 may include a panel 141, and a supporting member 142 for supporting the panel 141. The panel 141 may be implemented as a bendable panel (for example, OLED panel), and the supporting member 142 may cover a rear surface of the panel 141 and be transformable along with the panel 141. The supporting member 142 may preferably be made of a material (for example, stainless steel, titanium, carbon fiber, and etc.) which is elastically transformable to a predetermined extent.

In order for the flexible display unit 140 to be bendable, the image display device 100 may include a pressing member 160 for transforming the flexible display unit 140 and a drive part 150.

The pressing member 160 may be disposed to face the flexible display unit 140, and apply an external force to the flexible display unit 140 in a bending manner. As illustrated in FIG. 2, the pressing member 160 may be configured as a bar-like plate which extends in a widthwise direction of the supporting member 142. For example, the pressing member 160 may be provided in plurality, and the plurality of pressing members 160 may be disposed at both end portions in a lengthwise direction of the supporting member 142.

The drive part 150 may pull both ends of the pressing member 160 such that the pressing member 160 is bent. When the both ends of the pressing member 160 are pulled by the drive part 150, the pressing member 160 may be bent to press the flexible display unit 140. According to the mechanism, the flexible display unit 140 in the flat state may be bent into a curved (bent) shape.

The drive part 150 may be configured to pull the both ends of the pressing member 160 in a first direction such that the flexible display unit 140 can be transformed from the flat state into the bent state, and pull the both ends of the pressing member 160 in a second direction, which is different from the first direction, such that the flexible display unit 140 can be restored from the bent state into the flat state. Therefore, the flexible display unit 140 may be transformed in shape into the flat state or the bent state according to the direction that the drive part 150 pulls the both ends of the pressing member 160.

The pressing member 160 may be disposed in parallel to the flexible display unit 140. When the both ends are pulled by the drive part 150, the pressing member 160 may press at least one portion of the flexible display unit 140. For example, the supporting member 142 may be pressed by the both pulled ends of the pressing member 160 to be bent together with the panel 141.

The both ends of the pressing member 160 may be disposed to come in contact with the supporting member 142, or disposed with a predetermined spacing from the supporting member 142. When the both ends of the pressing member 160 are pulled by the drive part 150, they may be slid along a rear surface of the supporting member 142 with pressing the supporting member 142. The both ends of the pressing member 160 may be slidably coupled to the supporting member 142 by a sliding member 165, which has a rail structure.

Figure 4A:
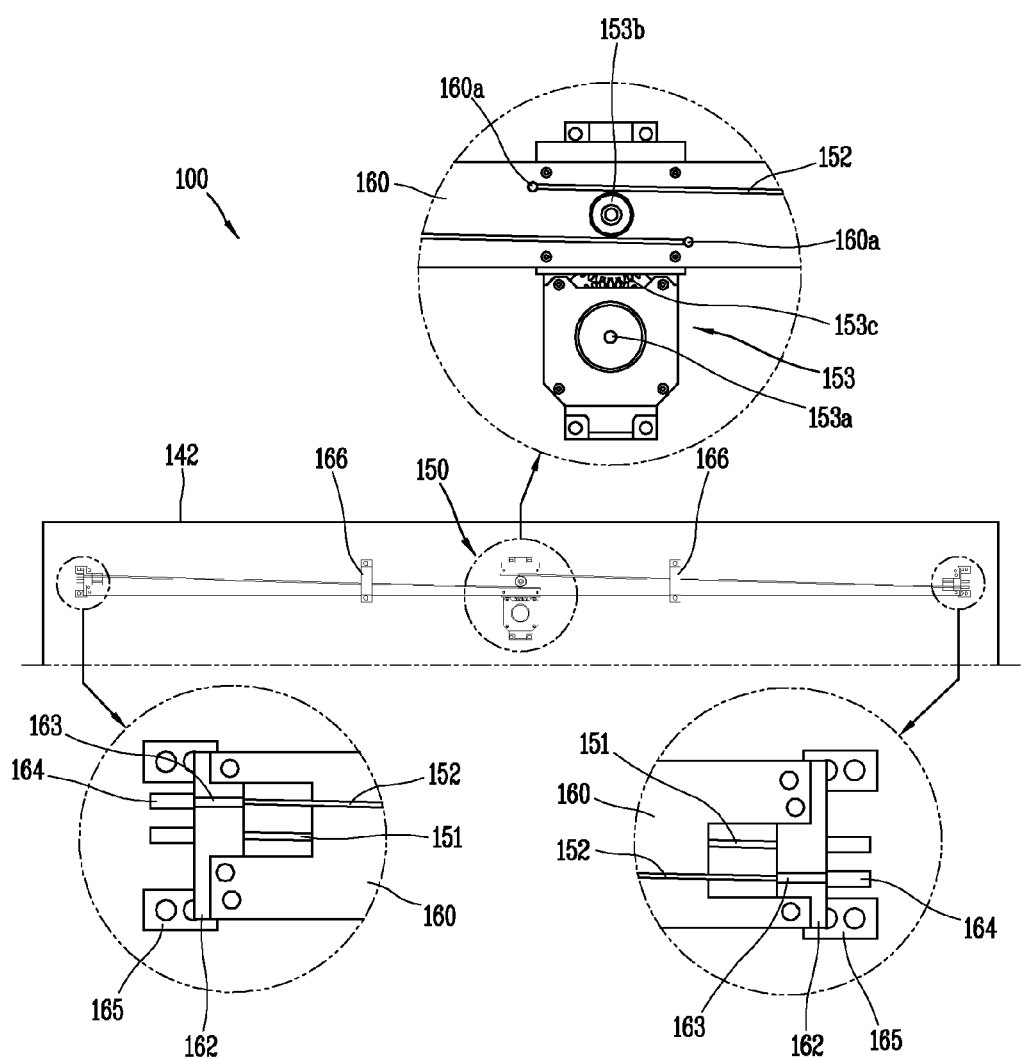
FIGS. 4A and 4B are rear and front conceptual views, respectively, of the structure illustrated in FIG. 3.
Figure 4B:
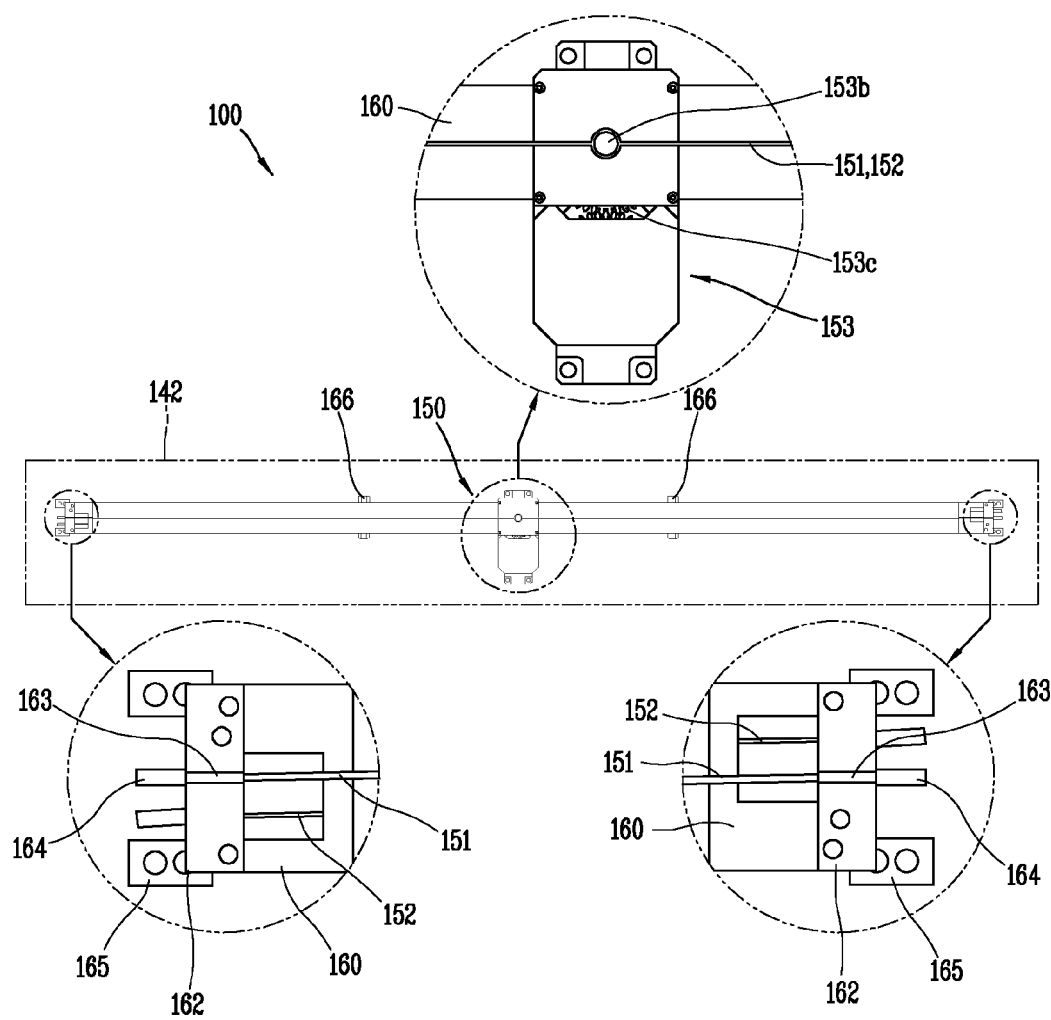
Figure 5:
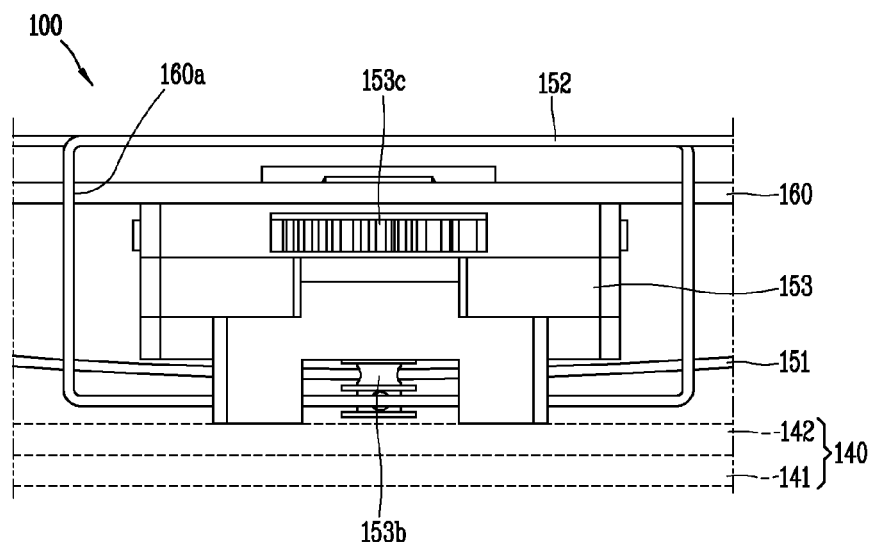
FIG. 5 is an enlarged view of a part A illustrated in FIG. 3.
Figure 6:
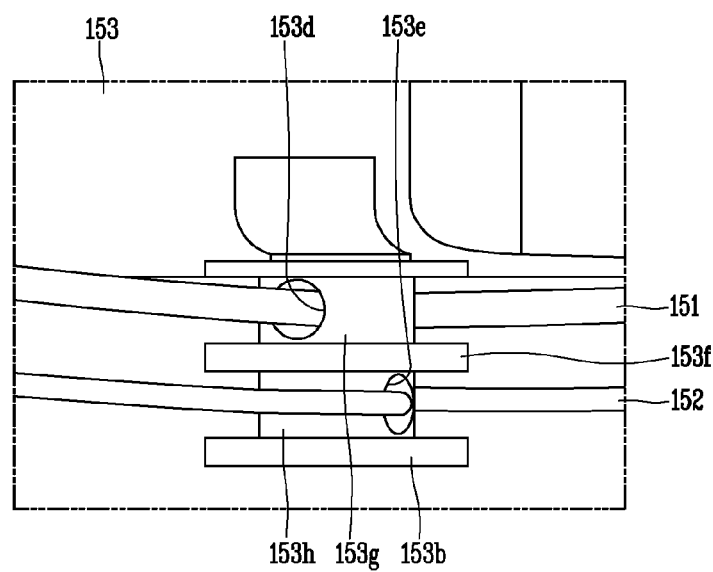
FIG. 6 is an enlarged perspective view of a driving shaft illustrated in FIGS. 4A and 4B.
Figure 7:
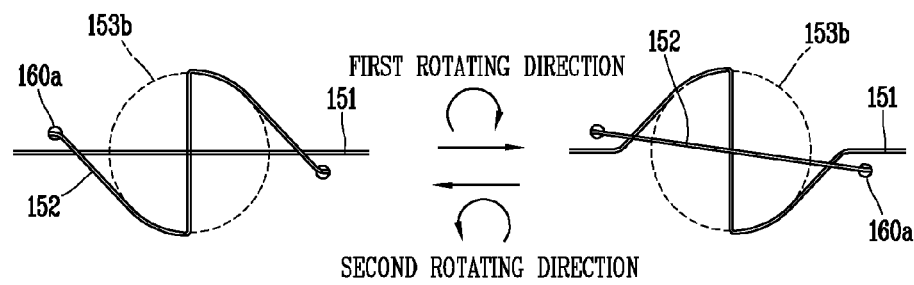
FIG. 7 is a conceptual view illustrating wound states of first and second wires upon conversion or restoration of the flexible display unit of FIG. 2 between a first state and a second state.
Figure 8A:
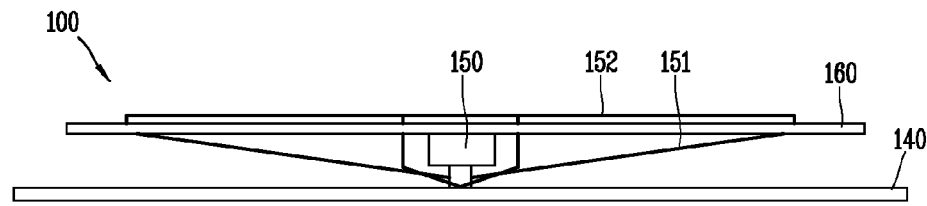
FIGS. 8A and 8B are conceptual views illustrating the flexible display unit illustrated in FIG. 2 that is laid in first and second states, respectively.
Figure 8B:
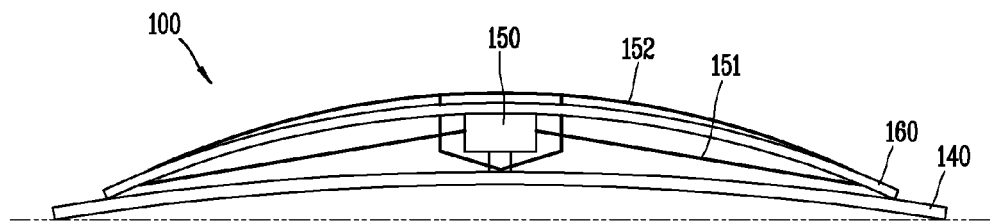

FIGS. 4A and 4B are rear and front conceptual views, respectively, of the structure illustrated in FIG. 3, FIG. 5 is an enlarged view of a part A illustrated in FIG. 3, FIG. 6 is an enlarged perspective view of a driving shaft 153b illustrated in FIGS. 4A and 4B, FIG. 7 is a conceptual view illustrating wound states of the first and second wires 151 and 152 upon conversion or restoration of the flexible display unit 140 of FIG. 2 between a first state and a second state, and FIGS. 8A and 8B are conceptual views illustrating the flexible display unit 140 illustrated in FIG. 2 that is laid in first and second states, respectively.

Referring to FIGS. 4A to 8B, the drive part 150 may include a driving unit 153 and a first wire 151.

The driving unit 153 may be coupled to the pressing unit 160 and the supporting member 142, respectively, and fix the pressing member 160 onto the rear surface of the supporting member 142. The driving unit 153 may preferably be mounted onto a central portion of the pressing member 160 to apply a uniform force to the both ends of the pressing member 160.

The driving unit 153 may include a driving shaft 153b which executes a rotation motion. The driving shaft 153b may be bi-directionally rotatable, namely, in first and second rotating directions. Hereinafter, the first rotating direction denotes a direction that the first wire 151 is wound such that the flexible display unit 140 is converted from a first state into a second state, and the second rotating direction is opposite to the first rotating direction and denotes a direction that a second wire 152 is wound such that the flexible display unit 140 is restored from the second state into the first state.

The driving shaft 153b may include a driving shaft dividing portion 153f which divides regions on which the first wire 151 and the second wire 152 are wound, respectively. The driving shaft dividing portion 153f, as illustrated, may protrude from an outer circumferential surface of the driving shaft 153b, and divide the driving shaft 153b into first and second regions 153g and 153h. The first wire 151 and the second wire 152 may be wound on the first and second regions 153g and 153h, respectively, with the driving shaft dividing portion 153f interposed therebetween, which may prevent interruption between the first and second wires 151 and 152.

A reduction gear 153c may be located between a rotation shaft 153a and the driving shaft 153b of the driving unit 153. The reduction gear 153c may allow a rotating speed of the driving shaft 153b to be appropriately reduced and a rotation force thereof to be increased.

The first wire 151 may be connected to the pressing member 160 and wound in response to rotation of the driving shaft 153b so as to pull the both ends of the pressing member 160 in the first direction. The first wire 151 may preferably be formed of a material with low elongation to be prevented from being stretched (elongated) by tension.

The first wire 151 may be inserted into a first insertion hole 153d formed on the driving shaft 153b. The first wire 151 may then bi-directionally extend from the first insertion hole 153d to be connected to the both ends of the pressing member 160. The first insertion hole 153d may be located to be in parallel to a lengthwise direction of the pressing member 160 in the first state. Here, the first wire 151 may have an initial tensile force. That is, the first wire 151 may be connected to the both ends of the pressing member 160 in a tense state and have a tensile force strong enough not to bend the pressing member 160.

When the driving shaft 153b is rotated in the first rotating direction in the first state, the first wire 151 may be wound around the driving shaft 153b. The both ends of the pressing member 160 which are connected with the first wire 151 may be pulled and press the flexible display unit 140. According to the mechanism, the flexible display unit 140 which was in the first state may be converted into the second state.

In order for the flexible display unit 140 which was in the second state to be restored to the first state, the drive part 150 may further include a second wire 152 connected to the pressing member 160 to pull the both ends of the pressing member 160 in a second direction. The second wire 152 may be inserted into a second insertion hole 153e formed on the driving shaft 153b, and bi-directionally extend from the second insertion hole 153e to be connected to the both ends of the pressing member 160. Similar to the first wire 151, the second wire 152 may preferably be formed of a material with low elongation to be prevented from being stretched by tension.

The second wire 152 may have an initial tensile force in the first state. That is, the second wire 152 may be connected to the both ends of the pressing member 160 in a tense state, and have a tensile force strong enough not to bend the pressing member 160.

The first insertion hole 153d and the second insertion hole 153e may be located at positions with spacing therebetween along an outer circumference of the driving shaft 153b. For example, the first insertion hole 153d and the second insertion hole 153e may be orthogonal to each other. Also, the first insertion hole 153d and the second insertion hole 153e may be located on the first and second regions 153g and 153h, which are divided by the driving shaft dividing portion 153f.

With the structure, when the driving shaft 153b is rotated by a preset angle in the first rotating direction in which the flexible display unit 140 is converted from the first state into the second state, the first wire 151 may be wound around the driving shaft 153b and the second wire 152 may be unwound from the driving shaft 153b. That is, the both ends of the pressing member 160 may be pulled by the first wire 151 in the first direction due to an increased tensile force of the first wire 151. On the other hand, the both ends of the pressing member 160 may not be pulled in the second direction due to a decreased tensile force of the second wire 152.

On the contrary, when the driving shaft 153b is rotated by a preset angle in the second rotating direction in which the flexible display unit 140 is converted from the second state into the first state, the second wire 152 may be wound on the driving shaft 153b and the first wire 151 may be unwound from the driving shaft 153b. That is, as the second wire 152 which has been relatively loosened has the increased tensile force, the both ends of the pressing member 160 may be pulled by the second wire 152 in the second direction. Hence, a pressing force may be released and accordingly, the flexible display unit 140 may be restored to the first state. On the other hand, the first wire 152 may have the decreased tensile force, and thereby have the initial tensile force.

The second wire 152 may be set to a state of being wound on the driving shaft 153b at least once in the second rotating direction when the flexible display unit 140 is laid in the first state. Accordingly, when the driving shaft 153b is rotated along the first rotating direction, the second wire 152 may be more unwound from the driving shaft 153b by the number of turns with respect to the driving shaft 153b. Consequently, a wider rotation range may be set for the driving shaft 153b.

In view of the structure, the first wire 151 may be connected to one surface of the pressing member 160 to pull the both ends of the pressing member 160 in the first direction in response to the rotation of the driving shaft 153b along the first rotating direction. On the other hand, the pressing member 160 may be provided with a through hole 160a, through which the second wire 152 is inserted such that the second wire 152 can extend from the driving shaft 153b to the other surface of the pressing member 160. The second wire 152 which extends to the other surface of the pressing member 160 through the through hole 160a may be connected to the other surface of the pressing member 160. Accordingly, the second wire 152 may pull the both ends of the pressing member 160 in the second direction, different from the first direction, in response to the rotation of the driving shaft 153b along the second rotating direction.

Meanwhile, in order to prevent the pressing member 160 from being buckled when the both ends thereof are pulled, the supporting member 142 may be provided with a supporting guide 166 installed to cover a part of the pressing member 160. The supporting guide 166 may be provided in plurality, which are disposed with a predetermined spacing therebetween along a lengthwise direction of the pressing member 160.

Figure 9A:
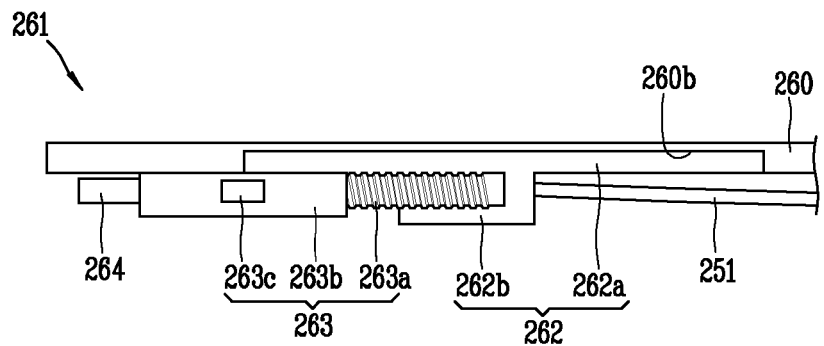
FIGS. 9A and 9B are conceptual views illustrating a mechanism of adjusting tension of wires by a tension adjustment part in accordance with an exemplary embodiment of the present disclosure.
Figure 9B:
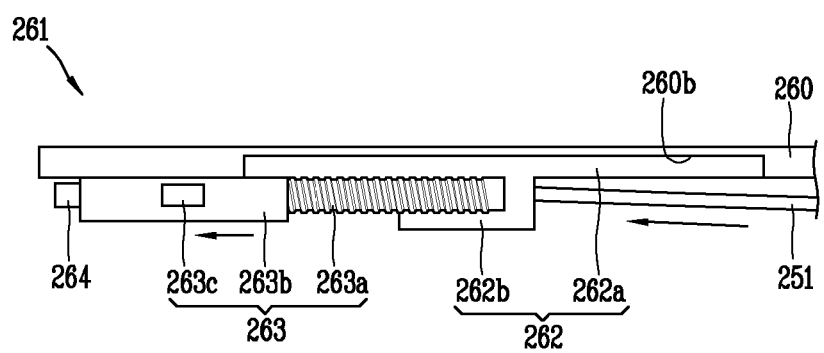
Figure 10:
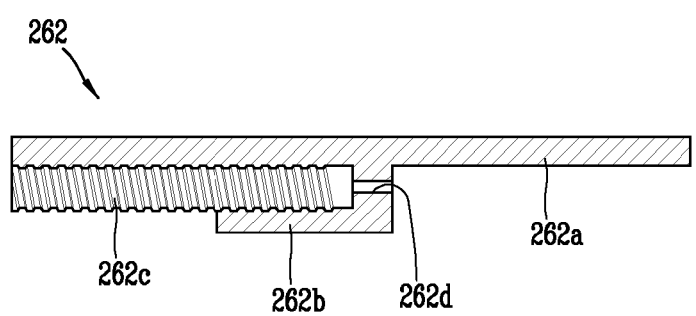
FIG. 10 is a sectional view of a frame member illustrated in FIG. 9A.

FIGS. 9A and 9B are conceptual views illustrating a mechanism of adjusting tension of wires by a tension adjustment part 261, and FIG. 10 is a sectional view of a frame member 262 illustrated in FIG. 9A.

A structure to be explained hereinafter may be applied to at least one of the first and second wires 151 and 152. Hereinafter, description will be given of an example that a tension adjustment part 261 adjusts a tensile force of a first wire 251.

Referring to FIGS. 9A to 10, the tension adjustment part 261 may be mounted to a pressing member 260. The tension adjustment part 261 may be connected to a first wire 251 to adjust a tensile force of the first wire 251. The tension adjustment part 261 may manually adjust the tensile force of the first wire 251 into a set value when the tensile force of the first wire 251 exceeds or is different from the set value during a fabrication of a product or due to winding during use.

The tension adjustment part 261 may include a frame member 262, a length adjusting unit 263 and a connection member 264.

The frame member 262 may be mounted to the pressing member 260 to define a space for installation of the length adjusting unit 263. The frame member 262 may be made of a material different from the pressing member 260. For example, the pressing member 260 may be made of a material (for example, a composite material such as CFRP), which exhibits high elasticity for the pressing member 260 to be bendable and restorable and also has high rigidity for the pressing member 260 to be uniformly bent. On the other hand, the frame member 262 may be made of a material (for example, a metal such a stainless steel), which exhibits predetermined levels of elasticity and rigidity and is relatively easily processed.

The length adjusting unit 263 may be mounted to the frame member 262 and changeable in length. The drawings illustrate that the length adjusting unit 263 includes first and second screws 263a and 263b whose length is changeable in a rotating manner. As illustrated, the first screw 263a may be mounted to the frame member 262 and the second screw 263b may be screw-coupled to the first screw 263a so as to get close to or away from the first screw 263a along a rotating direction thereof.

The first and second screws 263a and 263b may be provided with through holes, respectively, through which the first wire 251 is inserted. The second screw 263b may be provided with a manipulating portion 263c in a form of a recess or a protrusion.

The connection member 264 may be connected to the second screw 263b and the first wire 251 to adjust a tensile force of the first wire 251 by way of a length change. The connection member 264 may be formed in a shape of a sleeve which accommodates and fixes thereon an end portion of the first wire 251.

Meanwhile, an accommodation recess 260b may be recessed from one surface toward the other surface of the pressing member 260, and at least part of the frame member 262 may be accommodated in the accommodation recess 260a. As illustrated, the frame member 262 may include a base 262a and a protrusion 262b. The base 262a may be accommodated in the accommodation recess 260b formed on the one surface of the pressing member 260, and the protrusion 262b may protrude from the base 262a, thereby defining a space for mounting the first screw 263a therein. The protrusion 262b may be provided with a through hole 262d through which the first wire 251 is inserted. Screw threads 262c to which the first screw 263a is coupled may be formed on an inner surface of a frame which defines the mounting space of the first screw 263a.

Referring to the aforementioned exemplary embodiment, the tension adjustment part may be divided into first and second tension adjusting units connected to the first and second wires 151 and 152, respectively. Here, the first and second tension adjusting units may be mounted to at least one of one surface and the other surface of the frame member 162.

The first wire 151 may be disposed to be laid along one surface of the pressing member 160, and the second wire 152 may extend to the other surface of the pressing member 160 through the through hole 160a. In order to pull the both ends of the pressing member 160 in the second direction when the second wire 152 is wound, the second wire 152 may preferably be mounted to a surface opposite to the surface where the first wire 151 is disposed. The foregoing exemplary embodiment exemplarily illustrates that the first tension adjustment part is disposed on the one surface of the frame member 162 and the second tension adjustment part is disposed on the other surface of the frame member 162.

Figure 11:
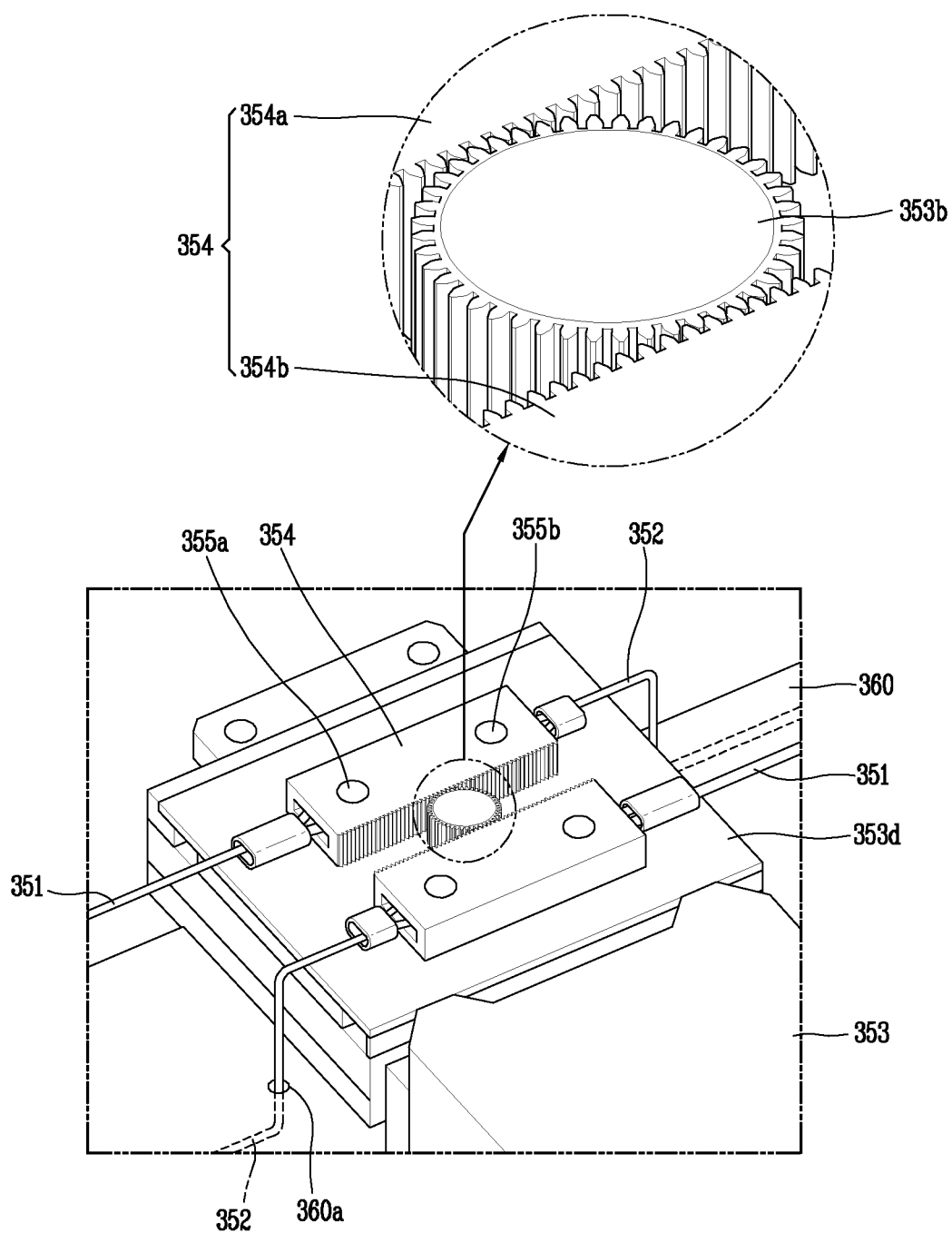
FIG. 11 is a perspective view illustrating a structure of transforming a shape of a flexible display unit in an image display device in accordance with another exemplary embodiment.
Figure 12A:
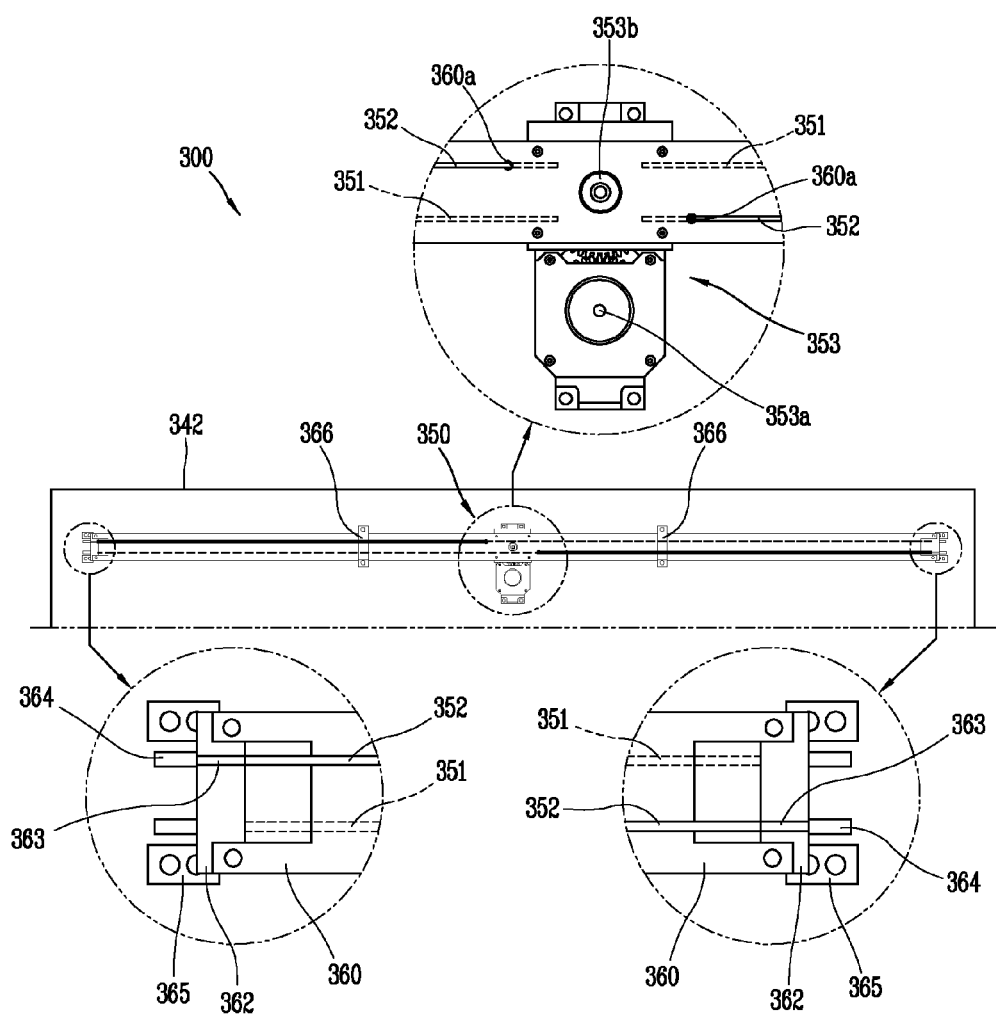
FIGS. 12A and 12B are rear and front conceptual views of the structure of FIG. 11, respectively.
Figure 12B:
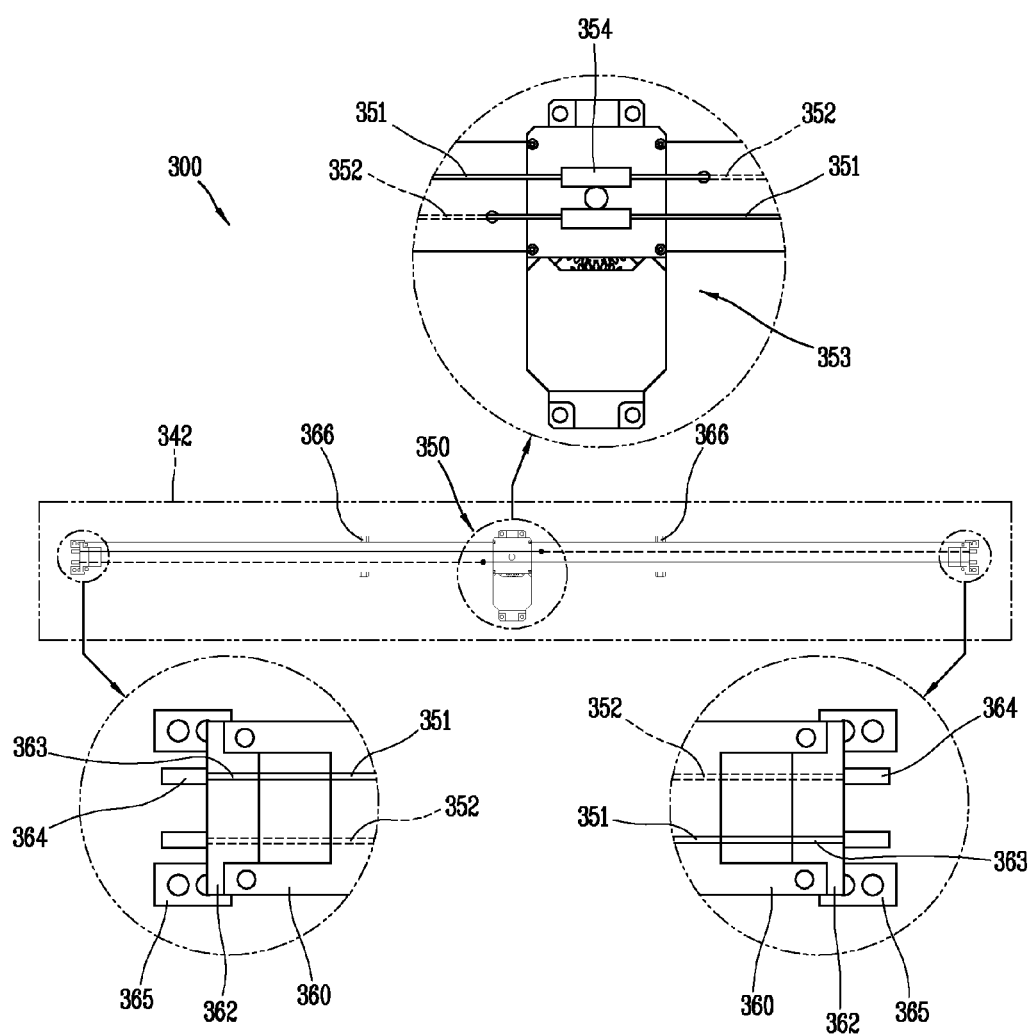
Figure 13A:
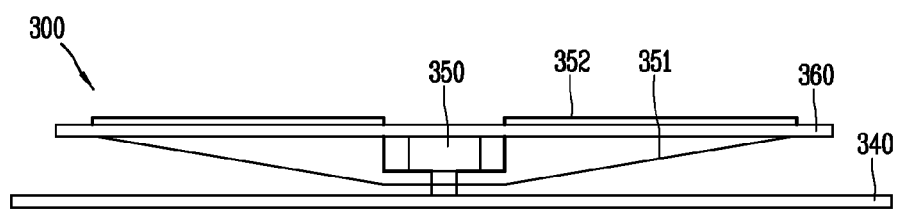
FIGS. 13A and 13B are conceptual views illustrating the flexible display unit illustrated in FIG. 11 that is laid in first and second states, respectively.
Figure 13B:
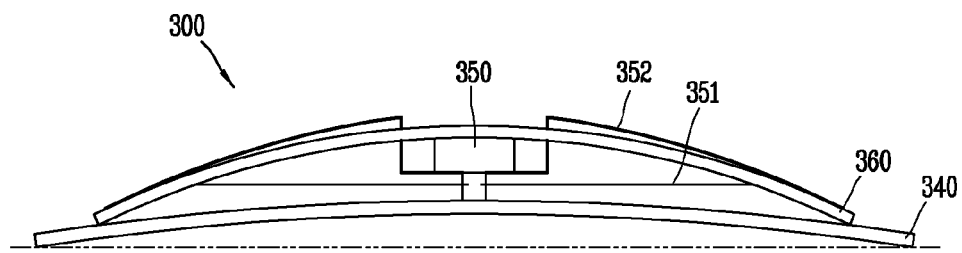

FIG. 11 is a perspective view illustrating a structure of transforming a shape of a flexible display unit 340 in an image display device 300 in accordance with another exemplary embodiment, FIGS. 12A and 12B are rear and front conceptual views of the structure of FIG. 11, respectively, and FIGS. 13A and 13B are conceptual views illustrating the flexible display unit 340 illustrated in FIG. 11 that is laid in first and second states, respectively.

As illustrated in FIGS. 11 to 13B, a drive part 350 in accordance with another exemplary embodiment may include a driving unit 353, a rack unit 354, and a first wire 351.

The driving unit 353 may be connected to a pinion 353b. The pinion 353b may be bi-directionally rotatable, namely, in first and second rotating directions. These drawings illustrate that the pinion 353b is rotatably disposed on a plate 353d located on a pressing member 360.

A reduction gear (not shown) may be connected between a rotation shaft 353a of the driving unit 353 and a rotation shaft of the pinion 353b. The reduction gear may appropriately reduce a rotation speed of the pinion and increase a rotational force to be increased. Those drawings illustrate that the plate 353d is disposed to cover at least part of the reduction gear to define an installation space for the pinion 353b and the rack unit 354.

The rack unit 354 may be slidable in response to rotation of the pinion gear 353b. These drawings illustrate that the rack unit 354 is slidably installed on the plate 353d. A rail structure may be disposed between the plate 353d and the rack unit 354 such that the rack unit 354 is slidable thereon.

The rack unit 354 may include a first rack 354a and a second rack 354b which are connected to the pinion 353b to be movable opposite to each other in response to the rotation of the pinion 353b. The first and second racks 354a and 354b may be disposed in parallel to the pressing member 360 with the pinion 353b interposed therebetween, so as to be slidable toward one end and the other end of the pressing member 360, respectively, responsive to the rotation of the pinion 353b.

The first wire 351 may extend from ends of the first and second racks 354a and 354b in opposite directions to each other, and be connected to both ends of the pressing member 360, respectively. In detail, the first wire 351 connected to the first rack 354a may be connected to one end of the pressing member 360 adjacent thereto, and the first wire 351 connected to the second rack 354b may be connected to the other end of the pressing member 360 adjacent thereto. The rack unit 354 may include fixing members 355a and 355b for fixing the first and second wires 351 and 352. The drawings illustrate that the first and second wires 351 and 352 are fixed by being tied, respectively, on the fixing members 355a and 355b, which have a shape of a bar.

With the structure, when the pinion 353b is rotated along a first rotating direction, the rack unit 354 may slid away from the end portion of the pressing member 360 to which the first wire 351 is connected. Hence, the first wire 351 may be pulled, and both ends of the pressing member 360 connected to the first wire 351 may be pulled in a first direction to be bent into a curved shape. According to the mechanism, the flexible display unit 340 may be pressed by the pressing member 360 to be converted from the first state into the second state.

The drive part 350 may further include a second wire 352 for pulling the pressing member 360 in a second direction, which is different from the first direction, to restore the flexible display unit 340 from the second state into the first state.

The second wire 352 may be connected to the rack unit 354 and the pressing member 360. In detail, the first wire 351 may be connected to one end of the first rack 354a and the second wire 352 which pulls the pressing member 360 in the second direction may be connected to the other end of the first rack 354a. Here, the second wire 352 may have a shape that it extends from the rack unit 354 with at least a part bent such that the second wire 352 is inserted through the pressing member 360. The bent second wire 352 may be inserted through the pressing member 360 and extended to the other surface of the pressing member 360 to be connected to an end thereof.

The first wire 351 may be connected to one surface of the pressing member 360 to pull the both ends of the pressing member 360 in the first direction, and the second wire 352 may be connected to the other surface of the pressing member 360 to pull the both ends of the pressing member 360 in the second direction.

With the configuration, when the pinion 353b is rotated along the second rotating direction in the second state, the rack unit 354 may be slid away from the end portion of the pressing member 360 to which the second wire 352 is connected. Hence, the second wire 352 may be pulled and accordingly the both ends of the pressing member 360 connected to the second wire 352 may be pulled in the second direction to be restored to the flat state.

According to the mechanism, the flexible display unit 340 may be restored to the flat state by virtue of release of a pressing force which is applied to both ends thereof. Here, when the pressing member 360 is slidably coupled to the flexible display unit 340, the flexible display unit 340 coupled with the pressing member 360 may be restored to the flat state by a restoring force applied thereto while the pressing member 360 is restored.

According to the present disclosure with the configurations, the flexible display unit may be smoothly bent and restored to the flat state.

Also, when a tensile force of a wire exceeds a set value during a fabrication of a product or due to winding during use, a tension adjustment part may manually adjust the tensile force of the wire into the set value.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. An image display device comprising: a flexible display unit bendable between a first state and a second state having different radii of curvature from each other; a pressing member disposed to face a rear surface of the flexible display unit and to be bent to press the flexible display unit; and a drive part to pull both ends of the pressing member such that the pressing member is bent, wherein the pressing member is slidable on the rear surface of the flexible display unit while pressing the rear surface when the both ends thereof are pulled by the drive part, wherein the drive part pulls the both ends of the pressing member in a first direction to convert the flexible display unit from the first state to the second state, and pull the both ends of the pressing member in a second direction, opposite to the first direction, to restore the flexible display unit from the second state to the first state, and wherein the drive part comprises: a driving unit having a driving shaft to execute a rotation motion; and a first wire connected to the pressing member, and wound responsive to rotation of the driving shaft so as to pull the both ends of the pressing member in the first direction.

2. The device of claim 1, further comprising a supporting guide disposed on the rear surface of the flexible display unit to cover a part of the pressing member in order to prevent buckling of the pressing member when the both ends of the pressing member are pulled.

3. The device of claim 2, wherein the supporting guide is provided in plurality, the plurality of supporting guides disposed with a predetermined spacing therebetween along a lengthwise direction of the pressing member.

4. The device of claim 1, wherein the driving shaft is provided with a first insertion hole in which the first wire is inserted, and the first wire bi-directionally extends from the first insertion hole to be connected to the pressing member.

5. The device of claim 4, wherein the first insertion hole is disposed in parallel to a lengthwise direction of the pressing member when the pressing member is in the first state.

6. The device of claim 4, wherein the drive part further comprises a second wire connected to the pressing member to pull the both ends of the pressing member in the second direction.

7. The device of claim 6, wherein the driving shaft is provided with a second insertion hole in which the second wire is inserted, and the second wire bi-directionally extends from the second insertion hole to be connected to the pressing member.

8. The device of claim 7, wherein the first and second insertion holes are located at positions spaced from each other along an outer circumference of the driving shaft.

9. The device of claim 8, wherein the first and second insertion holes are orthogonal to each other.

10. The device of claim 6, wherein the first wire is wound on the driving shaft and the second wire is unwound from the driving shaft when the driving shaft is rotated by a preset angle along a direction that the flexible display unit is converted from the first state to the second state.

11. The device of claim 6, wherein the first wire is connected to one surface of the pressing member to pull the both ends of the pressing member in the first direction, in response to the rotation of the driving shaft in a first rotating direction, and wherein the second wire is connected to an other surface of the pressing member to pull the both ends of the pressing member in the second direction, in response to the rotation of the driving shaft in a second rotating direction.

12. The device of claim 11, wherein the pressing member is provided with a through hole through which the second wire is inserted in such a manner that the second wire extends from the driving shaft and is connected to the other surface of the pressing member.

13. The device of claim 1, wherein the drive part further comprises a reduction gear to connect a rotation shaft of the driving unit and the driving shaft of the driving unit to each other.

14. The device of claim 1, wherein the drive part comprises: a driving unit connected to a pinion; a rack unit slidable in response to rotation of the pinion; and the first wire connected to the rack unit and the pressing member, respectively, to pull the pressing member in the first direction.

15. The device of claim 14, wherein the drive part further comprises a second wire connected to the rack unit and the pressing member, respectively, to pull the pressing member in the second direction, different from the first direction.

16. The device of claim 15, wherein the second wire extends from the rack unit with at least a part thereof bent to be inserted through the pressing member.

17. The device of claim 14, wherein the rack unit comprises first and second racks connected to the pinion to be slidable opposite to each other along the rotation of the pinion, and wherein the first wire extends from ends of the first and second racks in opposite directions to each other.

18. The device of claim 17, wherein the first wire is connected to one end of the first rack, and the second wire is connected to the other end of the first rack to pull the pressing member in the second direction, different from the first direction.

19. The device of claim 1, wherein the drive part pulls both ends of the pressing member by use of the first wire such that the pressing member is bent, and further comprising a tension adjustment part mounted onto the pressing member and connected to the first wire to adjust a tensile force of the first wire.

20. The device of claim 19, wherein the tension adjustment part comprises: a frame member formed of a material different from the pressing member and connected to the pressing member; a length adjusting unit disposed on the frame member and changeable in length; and a connection member connected to the length adjusting unit and the first wire, respectively, to adjust the tensile force of the first wire by changing the length of the length adjusting unit.

21. The device of claim 20, wherein the frame member comprises: a base accommodated in an accommodation recess formed on one surface of the pressing member; and a protrusion having a through hole through which the first wire is inserted, the protrusion protruding from the base such that the length adjusting unit is mounted thereto.

22. The device of claim 20, wherein the length adjusting unit comprises:
   a first screw mounted to the frame member; and
   a second screw coupled to the first screw and connected to the connection member.

\* \* \* \* \*